United States Patent
Cho et al.

[11] Patent Number: 6,071,826
[45] Date of Patent: Jun. 6, 2000

[54] METHOD OF MANUFACTURING CMOS IMAGE SENSOR LEAKAGE FREE WITH DOUBLE LAYER SPACER

[75] Inventors: Ching-Wen Cho, Chu-San; Hua-Yu Yang, Kaohsiung; Sen-Fu Chen, Taipei; Chih-Heng Shen, Hshiu-chu; Wen-Cheng Chien, Kaohsiung; Chang-Jen Wu, Taipei; Chi-Hsin Lo, Ping-Jeng; Hui-Chen Chu, San- Min Area Kaohsiung, all of Taiwan

[73] Assignee: Taiwan Semiconductor Manufacturing Company, Hsin-Chu, Taiwan

[21] Appl. No.: 09/249,259

[22] Filed: Feb. 12, 1999

[51] Int. Cl.[7] .................................................. H01L 21/00
[52] U.S. Cl. ........................ 438/723; 438/737; 438/740; 438/743
[58] Field of Search .................................. 438/719, 723, 438/724, 737, 738, 740, 743, 744, 267, 303, 366

[56] References Cited

U.S. PATENT DOCUMENTS

| | | | |
|---|---|---|---|
| 5,352,630 | 10/1994 | Kim et al. | 438/723 |
| 5,461,425 | 10/1995 | Fowler et al. | 348/294 |
| 5,702,972 | 12/1997 | Tsai et al. | 437/56 |
| 5,747,373 | 5/1998 | Yu | 438/305 |
| 5,763,312 | 6/1998 | Jeng et al. | 438/303 |
| 5,792,705 | 8/1998 | Wang et al. | 438/723 X |

*Primary Examiner*—William Powell
*Attorney, Agent, or Firm*—George O. Saile; Stephen B. Ackerman

[57] ABSTRACT

A method for forming a CMOS image sensor spacer structure. A polysilicon gate electrode is formed on a substrate; a thin layer of first dielectric is deposited over the exposed surfaces of the gate electrode and the top of the substrate. Next a second layer of dielectric is deposited after which etching is performed to create the electrode spacer. The deposited second layer of dielectric serves as an etch stop and prevents damage to the substrate surface between spacers of the gate electrodes. An alternate method uses a thin ply layer as the stop layer and, in so doing, source/drain damage caused by the white pixel problem.

37 Claims, 2 Drawing Sheets

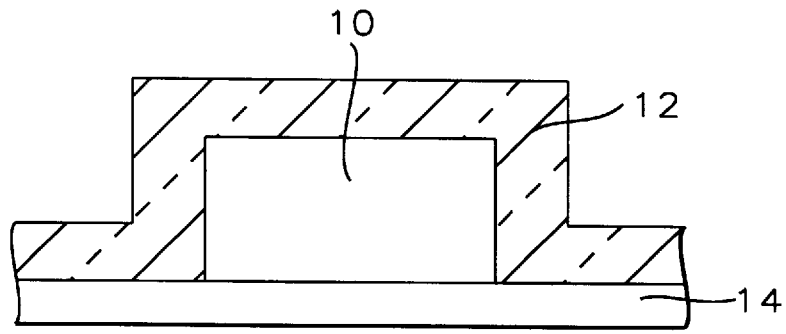
FIG. 1a - Prior Art
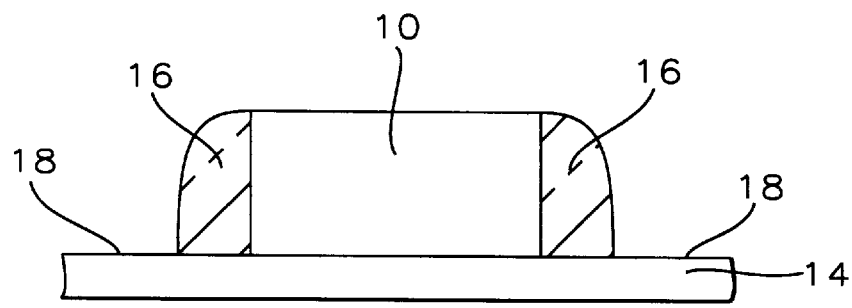
FIG. 1b - Prior Art
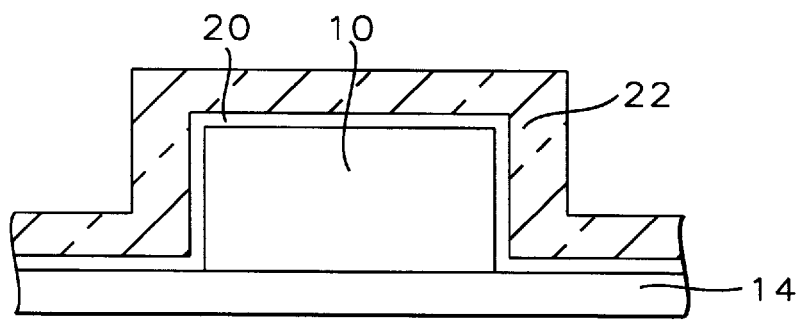
FIG. 2a
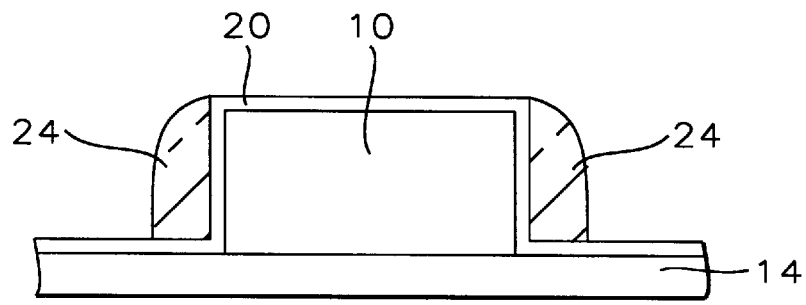
FIG. 2b

6,071,826

METHOD OF MANUFACTURING CMOS IMAGE SENSOR LEAKAGE FREE WITH DOUBLE LAYER SPACER

BACKGROUND OF THE INVENTION (1) Field of the Invention

The invention relates to the manufacturing of semiconductor devices and more specifically to the manufacturing of CMOS image sensors.

(2) Description of the Prior Art

An image sensor is used to convert an optical image focused on the sensor into electrical signals. U.S. Pat. No. 5,461,425 teaches that the image sensor typically includes an array of light detecting elements, where each element produces a signal corresponding to the intensity of light impinging on that element when an image is focused on the array. These signals may then be used, for example, to display a corresponding image on a monitor or otherwise used to provide information about the optical image.

One very common type of image sensor is a charge-coupled device (CCD). Integrated circuit chips containing a CCD image sensor have a relatively low yield and are expensive due to the specialized processing involved. The CCD's also consume a relatively large amount of power.

U.S. Pat. No. 5,461,425 further teaches that a much less expensive type of image sensor is formed as an integrated circuit using a CMOS process. In such a CMOS type image sensor, a photodiode or phototransistor (or other suitable device) is used as the light-detecting element, where the conductivity of the element corresponds to the intensity of light impinging on the element. The variable signal thus generated by the light detecting element is an analog signal whose magnitude is approximately proportional (within a certain range) to the amount of light impinging on the element.

It is known to form these light-detecting elements in a two-dimensional core array which is addressable by row and column. Once a row of elements has been addressed, the analog signals from each of the light detecting elements in the row are coupled to the respective columns in the array.

An analog-to-digital (AID) converter may then be used to convert the analog signals on the columns to digital signals so as to provide only digital signals at the output of the image sensor chip.

What is needed is an inexpensive, but highly efficient, image sensor, which produces reliable images. Implied in this is that leakage current in the spacer region within the image sensor is reduced to a minimum. The present invention addresses the reduction in damage to the substrate surface and, with that, a reduction of the leakage current in the spacer region.

FIG. 1 shows a Prior Art gate electrode with the etching of the spacer, as follows:

FIG. 1a shows the poly silicon gate electrode 10, a layer 12 of tetra-ethyl-ortho-silicate (TEOS) has been deposited over the gate electrode 10 and the top surface of substrate 14. FIG. 1a shows that only one layer of the dielectric TEOS is deposited in order to form the gate electrode spacers.

FIG. 1b shows the results of the spacer etch, gate electrode spacers 16 are formed after etching has been completed. It is apparent from FIG. 1b that lack in control of the etching or over-etching can readily cause damage the surface areas 18 of substrate 14.

Using current fabrication technology, it is well known that defects in the substrate cause leakage current between the gate electrodes of the image sensor, especially where the substrate defects are caused by plasma damage. It is therefore of key importance to produce a substrate surface that is free of damage and, more particularly, to be able to perform spacer etching without causing damage to the substrate surface. Current practice uses a single layer of dielectric above the spacer between the gate electrodes of the image sensor. With only a single layer of dielectric, it is difficult to sense and control the etch stop above the substrate. This difficulty in controlling the etching process results in substrate surface damage; this in turn results in leakage current between the gate electrodes of the CMOS image sensor device.

An additional problem is that, during the growth of field oxide, a phenomenon occurs that causes defects when the gate oxide is grown. This problem is referred to as white ribbon or white pixels. A thin layer of silicon nitride can form on the silicon surface (i.e., the pad-oxide/silicon surface interface) as a result of the reaction of $NH_3$ and silicon at that interface. When the gate oxide is grown, the growth rate becomes impeded at the locations where the silicon nitride has been formed. The gate oxide is thus thinner at these locations than elsewhere, causing low-voltage breakdown of the gate oxide.

U.S. Pat. No. 5,702,972 (Tsai et al.) U.S. Pat. No. 5,747,373 (Yu) and U.S. Pat. No. 5,763,312 (Jeng et al.) show SiN/Ox double spacers.

U.S. Pat. No. 5,747,373 (Yu) shows an oxide/SiN double spacer.

U.S. Pat. No. 5,461,425 (Fowler et al.) shows a CMOS image sensor.

SUMMARY OF THE INVENTION

It is the primary object of the invention is to reduce damage to the substrate surface between the spacers in etching CMOS spacers.

It is the another object of the invention is to reduce leakage current in the substrate surface between the spacers of the CMOS image sensor.

It is the another object of the invention is to improve control of the etching process when etching CMOS image sensor spacers.

It is the another object of the invention to reduce CMOS image sensor sensitivity to substrate damage.

The present invention teaches a CMOS image sensor comprising gate electrodes and a spacer structure.

Under the first embodiment of the invention, a polysilicon gate electrode is formed on a semiconductor substrate; a thin layer of silicon nitride ($Si_3N_4$) is deposited over the exposed surfaces of the gate electrode and the top of the substrate between adjacent gate electrodes. Next a layer of TEOS is deposited after which the etching is performed to create the electrode spacers. The deposited layer of silicon nitride serves as an etch stop layer and, in so doing, prevents damage to the substrate surface between the spacers of the gate electrodes.

Under the second embodiment of the invention, a polysilicon gate electrode is formed on a semiconductor substrate; a thin layer of polisilicon is deposited over the exposed surfaces of the gate electrode and the top of the substrate between adjacent gate electrodes. Next a layer of TEOS is deposited after which the etching is performed to create the electrode spacers. The deposited layer of polysilicon serves as an etch stop layer and, in so doing, prevents the growth of a thin layer of silicon nitride on the silicon surface (i.e., at the pad-oxide with silicon interface) and, in so doing, prevents low-voltage breakdown at the gate oxide.

BRIEF DESCRIPTION OF THE DRAWINGS

FIG. 1 shows Prior Art formation of the electrode gate spacer, as follows:

FIG. 1a shows the Prior Art gate electrode with a layer of TEOS deposited over the gate electrode and the substrate surface.

FIG. 1b shows the Prior Art formation of the electrode spacers.

FIG. 2 shows the formation of the electrode gate spacers under the first embodiment of the present invention, as follows:

FIG. 2a shows the gate electrode with the deposition of a layer of silicon nitride over which a layer of TEOS is deposited.

FIG. 2b shows the formation of the gate electrode spacers after the etching has been completed.

FIG. 3 shows the formation of the electrode gate spacers under the second embodiment of the present invention, as follows:

DESCRIPTION OF THE PREFERRED EMBODIMENT

Figure 3A:
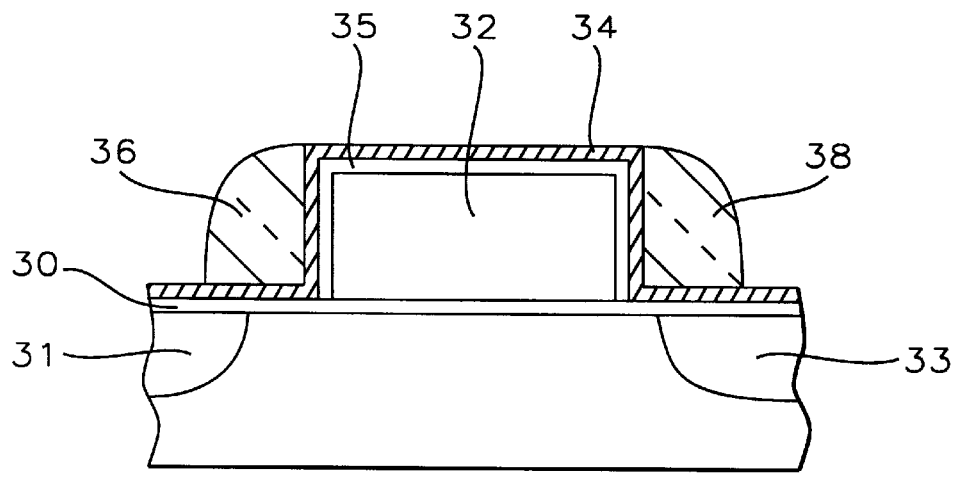
FIG. 3a shows the formation of the gate electrode with the deposition of a poly stop layer.

Referring now more specifically to FIG. 2a, there is shown a cross section of the substrate 14 with a gate electrode 10 formed on the surface of the substrate. A thin layer 20 of silicon nitride ($Si_3N_4$) has been deposited over the exposed sides of the gate electrode 10 and over the exposed surface of the substrate 14. A layer 22 of TEOS has further been deposited over the layer 20 of silicon nitride. Typical minimum distance between the gate electrodes 10 for a 0.5 um product is 0.5 um.

FIG. 2b shows a cross section of the substrate 14, the gate electrode 10, the layer 20 of silicon nitride and the electrode spacers 24 formed by etching the previously deposited layer of TEOS (22, FIG. 2a). It must be noted that the layer 20 of silicon nitride is present not only at the top and the sidewalls of the gate electrode 10 but extends over the surface of the substrate 14 even where the TEOS has been etched away. In these areas, where the layer 20 of silicon nitride extends beyond the electrode spacers 24, the silicon nitride 20 serves as an etch stop for the surface of the substrate and assures that the etching does not affect the surface of the substrate. Surface damage to the substrate surface is, in this manner, prevented.

Typical process conditions for the deposition of the layer 20 of silicon nitride is a LPCVD at a temperature of about 750 degrees C., a layer 20 of about 190 Angstrom of $Si_3N_4$ is deposited.

The TEOS layer 22 is typically deposited at a temperature of about 750 degrees C. to a thickness of about 2000 Angstrom.

Typical width of spacers 24 is about 0.1 to 0.15 um.

The etching of the TEOS layer (layer 22, FIG. 2a) is typically an RIE etch using $CF_4/CHF_3$ as etchant gasses.

Experimental results confirm the considerable reduction in leakage current that has been obtained by applying the layer of silicon nitride prior to the deposition of the layer of TEOS. For instance, the following are measure drain top substrate leakage currents measured when a voltage of 5 volts is applied between the drain electrode and the substrate. Under Prior Art conditions, where no layer of silicon nitride is applied first, the leakage current was measured as being 29.03 nA. Using the structure of the present invention and biasing with the same voltage, a leakage current of 2.45 pA was measured.

It must further be note that a layer of silicon nitride has been introduced between the (vertical) sidewall of the spacer and the gate electrode. This added layer forms a buffer between the sidewall of the spacer and the gate electrode and reduces leakage within this buffer area.

Referring now to FIG. 3a, there is shown a thin oxide layer 30 grown over the silicon surface. The growth of this oxide layer 30 is essential as a defect-free, very thin, high quality oxide without contamination is essential for proper device operation. The gate oxide is grown only in the exposed active region. The drain current in a MOS transistor is inversely proportional to the gate-oxide thickness. As a result, the gate oxide is normally made as thin as possible, commensurate with oxide breakdown and reliability considerations. Oxide layer 30 typically has a thickness of about 125 Angstrom.

The poly gate 32 is next created, a thin poly film 34 is now deposited over the poly gate 32 and the exposed surface of the layer 30 of gate oxide. The TEOS is next deposited, the TEOS is etched for the formation of the spacers 36 and 38. Source/drain regions are indicated with 31 and 33 respectively. Typical thickness for the thin poly film 34 is between 100 and 200 Angstrom.

To be noted in FIG. 3a is the existence of a gap 35 surrounding the sides and top of the gate electrode 32. This gap 35 is a thermal oxide layer which oxidized during the $WSi_x$ anneal process, the thickness of this gap is typically about 120 Angstrom.

Figure 3B:
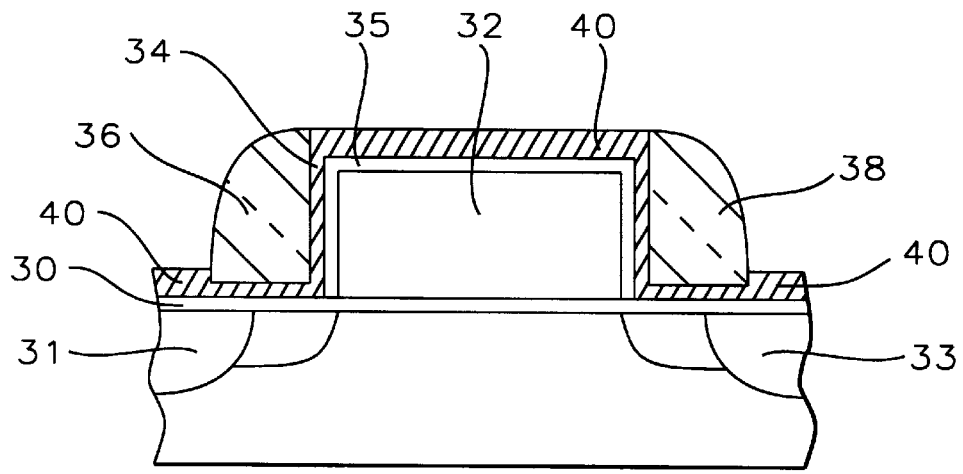
FIG. 3b shows the oxidation of the poly stop layer.

FIG. 3b shows the oxidation 40 of the poly film on top of the poly gate and adjacent to the spacers 36 and 38.

Figure 3C:
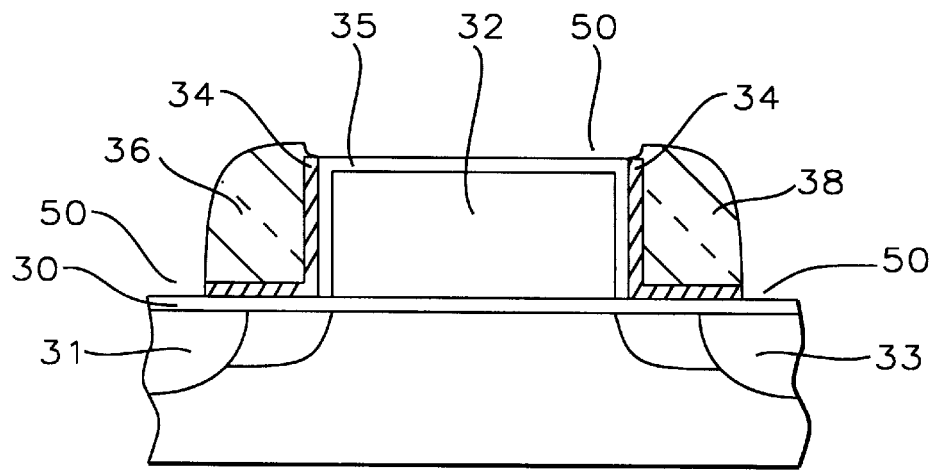
FIG. 3c shows the etching of the poly stop layer.

FIG. 3c shows the completion 50 of the dry etching of the poly film on top of the poly gate and adjacent to the spacers 36 and 38. Layers 34 have now been formed around the spacers that prevent source/drain damage and the formation of the previously highlighted white pixels. The oxidation of the poly film 34 is typically a wet oxidation process. The poly film is used as an etch stop layer in etching the spacers.

From the foregoing it will be clear that, although a specific embodiment of the present invention has been described herein for purposes of illustration, various modifications to the present invention may be made without deviating from the spirit and scope of the present invention. Accordingly, the present invention is not limited except as by the appended claims.

What is claimed is:

1. A method for forming a transistor, comprising the steps of:

securing a semiconductor substrate;

depositing a gate dielectric over said semiconductor substrate;

forming a gate electrode over said gate dielectric;

depositing a first dielectric over said gate electrode;

depositing a second dielectric over said first dielectric; and etching back said second dielectric.

2. The method of claim 1 wherein said gate dielectric contains oxide.

3. The method of claim 1 wherein said gate electrode contains polysilicon.

4. The method of claim 1 wherein said first dielectric contains silicon nitride ($Si_3N_4$).

5. The method of claim 1 wherein said second dielectric contains tetra-ethyl-ortho-silicate (TEOS).

6. The method of claim 1 further comprising the step of oxidizing the gate electrode before depositing said first dielectric layer, thereby forming a reox layer.

7. The method of claim 1 wherein said first dielectric layer has a thickness in the range of approximately 50 Angstrom to 300 Angstrom and the second dielectric layer has a thickness in the range of approximately 800 to 3000 Angstrom.

8. The method of claim 6 wherein said reox layer has a thickness in the range of approximately 50 to 500 Angstrom while the first dielectric layer has a thickness in the range of approximately 50 to 300 Angstrom while the second dielectric layer has a thickness in the range of approximately 800 to 3000 Angstrom.

9. The method of claim 1 wherein said etching uses a substantially anisotropic etch using $CF_8/CHF_3$ as etchant thereby leaving said first layer of dielectric intact while forming spacers said spacers being adjacent to said gate electrode whereby said spacers are separated from said gate electrode and said substrate surface by said first dielectric said spacers to have a width within the range between 0.1 and 0.15 um.

10. The method of claim 1 wherein said first dielectric layer is deposited using LPCVD or PECVD technology, at a temperature between about 500 to 1000 degrees C., to a thickness between 50 to 300 Angstrom.

11. The method of claim 1 wherein said second dielectric layer is deposited using LPCVD or PECVD technology, at a temperature between about 500 to 1000 degrees C., to a thickness between 800 to 3000 Angstrom.

12. A method for forming a transistor, comprising the steps of:

securing a semiconductor substrate;

depositing a layer of gate dielectric over said semiconductor substrate said dielectric containing an oxide thereby forming a gate oxide;

forming a gate electrode over said dielectric said gate electrode containing a poly silicon;

depositing a first dielectric over the exposed sides of said gate electrode and over the exposed surface of said layer of gate dielectric said first dielectric layer containing a nitride;

depositing a second dielectric directly over said first dielectric layer said second dielectric containing a silicate; and etching back said second dielectric layer using a substantially anisotropic etch, thereby leaving said first dielectric layer intact while thereby forming spacers said spacers being adjacent to said gate electrode whereby said spacers are separated from said gate electrode and said gate oxide by said first dielectric.

13. The method of claim 12 wherein said gate electrode contains polysilicon.

14. The method of claim 12 wherein said first dielectric layer has a thickness in the range of approximately 50 Angstrom to 300 Angstrom and the second dielectric layer has a thickness in the range of approximately 800 to 3000 Angstrom.

15. The method of claim 12 wherein said nitride contains silicon nitride ($Si_3N_4$).

16. The method of claim 12 wherein said silicate contains tetra-ethyl-ortho-silicate (TEOS).

17. The method of claim 12 further comprising the step of oxidizing the gate electrode before depositing said first dielectric layer, thereby forming a reox layer.

18. The method of claim 12 wherein said reox layer has a a thickness in the range of approximately 50 to 500 Angstrom while the first dielectric layer has a thickness in the range of approximately 50 to 300 Angstrom while the second dielectric layer has a thickness in the range of approximately 800 to 3000 Angstrom.

19. The method of claim 12 wherein said etching uses a substantially anisotropic etch using $CF_8/CHF_3$ as etchant thereby leaving said first layer of dielectric intact while forming spacers said spacers being adjacent to said gate electrode whereby said spacers are separated from said gate electrode and said gate oxide by said first dielectric said spacers to have a width within the range between 0.1 and 0.15 um.

20. The method of claim 12 wherein said first dielectric layer is deposited using LPCVD or PECVD technology, at a temperature between about 500 to 1000 degrees C., to a thickness between 50 to 300 Angstrom.

21. The method of claim 12 wherein said first dielectric layer is deposited using LPCVD or PECVD technology, at a temperature between about 500 to 1000 degrees C., to a thickness between 800 to 3000 Angstrom.

22. A method for forming a transistor, comprising the steps of:

securing a semiconductor substrate;

depositing a layer of gate oxide;

forming a gate electrode over said gate oxide;

depositing a thin polysilicon over said gate electrode;

depositing a second dielectric over said thin polysilicon;

etching back said second dielectric;

oxidizing said thin polysilicon; and removing the remainder of said thin polysilicon.

23. The method of claim 22 wherein said gate dielectric contains oxide.

24. The method of claim 22 wherein said gate electrode contains polysilicon.

25. The method of claim 22 wherein said second dielectric contains tetra-ethyl-ortho-silicate (TEOS).

26. The method of claim 22 further comprising the step of oxidizing the gate electrode before depositing said first dielectric layer, thereby forming a reox layer.

27. The method of claim 22 wherein said thin polysilicon layer has a thickness in the range of approximately 50 Angstrom to 300 Angstrom and the second dielectric layer has a thickness in the range of approximately 800 to 3000 Angstrom.

28. The method of claim 27 wherein said reox layer has a thickness in the range of approximately 50 to 500 Angstrom while the thin polysilicon layer has a thickness in the range of approximately 50 to 300 Angstrom while the second dielectric layer has a thickness in the range of approximately 800 to 3000 Angstrom.

29. The method of claim 22 wherein said second dielectric layer is deposited using LPCVD or PECVD technology, at a temperature between about 300 to 800 degrees C., to a thickness between 800 to 3000 Angstrom.

30. A method for forming a transistor, comprising the steps of:

securing a semiconductor substrate;

depositing a layer of gate dielectric over said semiconductor substrate said dielectric containing an oxide thereby forming a gate oxide;

forming a gate electrode over said dielectric said gate electrode containing a poly silicon;

depositing a polysilicon over the exposed sides of said gate electrode and over the exposed surface of said layer of dielectric;

depositing a second dielectric directly over said polysilicon layer said second dielectric containing a silicate;

etching back said second dielectric layer using a substantially anisotropic etch, thereby leaving said polysilicon layer intact while thereby forming spacers said spacers being adjacent to said gate electrode whereby said spacers are separated from said gate electrode by said polysilicon;

oxidizing said polysilicon; and etching the remainder of said unoxidized polysilicon.

31. The method of claim 30 wherein said gate electrode contains polysilicon.

32. The method of claim 30 wherein said polysilicon layer has a thickness in the range of approximately 50 Angstrom to 300 Angstrom and the second dielectric layer has a thickness in the range of approximately 800 to 3000 Angstrom.

33. The method of claim 30 wherein said second dielectric contains tetra-ethyl-ortho-silicate (TEOS).

34. The method of claim 30 further comprising the step of oxidizing the gate electrode before depositing said first dielectric layer, thereby forming a reox layer.

35. The method of claim 30 wherein said reox layer has a a thickness in the range of approximately 50 to 500 Angstrom while the polysilicon layer has a thickness in the range of approximately 50 to 300 Angstrom while the second dielectric layer has a thickness in the range of approximately 800 to 3000 Angstrom.

36. The method of claim 30 wherein said etching said second dielectric uses a substantially anisotropic etch thereby leaving said polysilicon intact while forming spacers said spacers being adjacent to said gate electrode whereby said spacers are separated from said gate electrode by said polysilicon.

37. The method of claim 30 wherein said second dielectric layer is deposited using LPCVD or PECVD technology, at a temperature between about 300 to 800 degrees C., to a thickness between 800 to 3000 Angstrom.

* * * * *